United States Patent [19]

Currie et al.

[11] Patent Number: 4,613,860
[45] Date of Patent: Sep. 23, 1986

[54] CODER-DECODER FOR PURGED BINARY BLOCK CODES

[75] Inventors: Robert J. Currie, Salt Lake City; Craig K. Rushforth, Kaysville; John W. Zscheile, Jr., Farmington, all of Utah

[73] Assignee: Sperry Corporation, New York, N.Y.

[21] Appl. No.: 561,503

[22] Filed: Dec. 14, 1983

[51] Int. Cl.$^4$ .................... H04Q 9/00; G07F 11/12
[52] U.S. Cl. .................... 340/825.57; 371/37
[58] Field of Search .............. 340/825.57; 371/2, 37, 371/47; 370/102; 375/26, 106, 94

[56] References Cited

U.S. PATENT DOCUMENTS

| | | | |
|---|---|---|---|
| 4,345,325 | 8/1982 | Gandini et al. | 375/106 |
| 4,382,300 | 5/1983 | Gupta | 371/37 |
| 4,389,636 | 6/1983 | Riddle, Jr. | 371/47 |
| 4,397,022 | 8/1983 | Weng et al. | 371/37 |
| 4,414,667 | 11/1983 | Bennett | 371/37 |

*Primary Examiner*—Donald J. Yusko
*Attorney, Agent, or Firm*—John B. Sowell; Thomas J. Scott; Marshall M. Truex

[57] ABSTRACT

Transmitting and receiving apparatus for transmitting data includes a purged code encoder at the transmitter for encoding digital data into constant weight unbalanced codewords representative of the digital data. The constant weight unbalanced codewords containing error correction bits are preferably transmitted as balanced codewords and are decoded at the receiver employing Golay decoders or algebraic decoders to recover the original digital data without the requirement of a large number of matched filter previously employed for decoding.

11 Claims, 4 Drawing Figures

CODER-DECODER FOR PURGED BINARY BLOCK CODES

BACKGROUND OF THE INVENTION

1. Related Applications

This invention relates to our copending application Ser. No. 06/389,733 entitled "SHARED ENERGY SIGNALING APPARATUS", filed 18 June 1982.

2. Field of the Invention

This invention relates to a novel coder-decoder of the type employed in transmitting and receiving apparatus. More particularly, the present invention employs a purged code encoder for generating constant-weight unbalanced codewords containing error correction bits modulated with a balanced code set signal to provide a balanced code signal for transmission. The transmitted balanced code signal is demodulated and decoded to recover the original data signals.

3. Description of the Prior Art

The above-referenced copending application entitled "SHARED ENERGY SIGNALING APPARATUS" modulated the unbalanced raw data stream with a balanced code signal. However, this application did not explain the unbalanced data stream or attempt any explanation of how an error correction code could be employed at the transmitter end.

It is possible to add filler bits to a data stream to be transmitted in order to assure a data imbalance. Such filler bits are not related in any way to the data being transmitted, thus, the performance of the transmitting and receiving system is degraded because less power is available for each of the data bits. As an example of employing filler bits, it is possible to send sixteen bits of data and then to follow the data bits with eight filler bits of ones or zeros to achieve a desired unbalance. When the filler bits are added to achieve the unbalance, the block bits which comprise the designated group of bits may or may not have the desired unbalance even though the average unbalance of the data stream is achieved over a long period of transmission.

It is possible to impose an error correction code on the filled data stream bits which most likely would rebalance the data stream so that the desired unbalance is no longer achieved. Further, it would be possible to apply error correction bits to the original data bits before the filler bits are added to the error corrected data stream. Employing this technique, it is more likely that the desired unbalance would be achieved in the average of the data stream but this would not assure that the unbalance is uniform over desired blocks of data bits or over short periods of time.

When it is necessary to meet a particular requirement for unbalance in a data stream, it would be desirable to accomplish the unbalance by employing structure which is both simple and efficient.

SUMMARY OF THE INVENTION

It is a principal object of the present invention to provide a specific unbalance to a data stream which is substantially uniform over both short and long lengths of data.

It is another principal object of the present invention to provide a specific unbalance to a data stream employing a simplified an efficient circuit structure.

It is a further object of the present invention to provide a purged code encoding and decoding apparatus for achieving unbalance in a data stream.

It is another object of the present invention to provide an extend Golay purged code encoding and decoding apparatus.

It is a general object of the present invention to provide error correction purged code decoding means which permits simplified decoding techniques to be employed rather than more complex matched filter decoding.

According to these and other objects of the present invention, there is provided in a transmitting and receiving apparatus a purged code encoder which is coupled to the data stream for altering the data stream to a desired format. Further, there is provided in the receiver and detector a purged code-decoder which recovers the original data in the unbalanced data stream and also provides error detection.

DESCRIPTION OF THE PREFERRED EMBODIMENT

Figure 1:
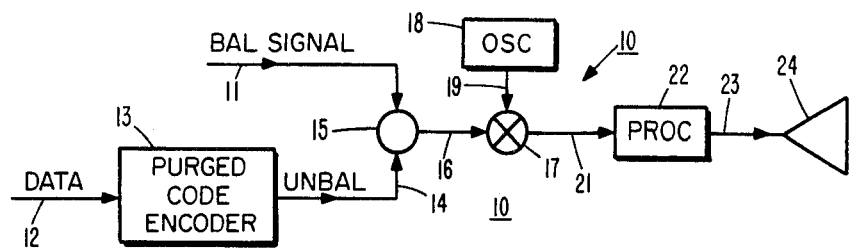
FIG. 1 is a logic block diagram circuit of a portion of a transmitter showing the preparation of coded data signals processed for transmission.

The logic block diagram shown in FIG. 1 is representative of a portion of a transmitter 10 for transmitting spread spectrum coded signals. A balance code signal, such as a pseudonoise spread spectrum signal, is applied on line 11 and is a known signal. A data signal is applied to line 12. If the signal at line 12 is not in digital form, it is converted to a digital form signal for application at line 12. The signal on line 12 is applied to a purged code encoder 13 which will be explained in more detail hereinafter. The balanced data on line 12 is converted to a predetermined unbalanced form on line 14 before being applied to a means for combining the balanced signal on line 11 with the unbalanced signal on line 14. The means 15 for combining the signals may be in the form of a modulo-2 adder or a conventional mixer. The combined output from means 15 produces a balance signal on line 16 which is applied to mixer 17. A carrier frequency oscillator 18 provides a signal on line 19 which is applied to the mixer 17 to produce a modulated carrier signal on line 21. The modulated carrier signal is applied to a signal processor 22 before being applied via line 23 to antenna 24.

For purposes of this application, the term "unbalanced" refers to the ratio of zero bits to one bits. The short term unbalance is applicable to a predetermined block of bits in the form of a codeword, whereas, the long term unbalance is applicable to the data stream over a longer period of time. In the preferred embodiment of the present invention, a typical long term unbalance of the data stream on line 14 is in the order of magnitude of two to one to three to one which has been found to be sufficient to enable carrier tracking as will be explained in detail hereinafter.

Figure 2:
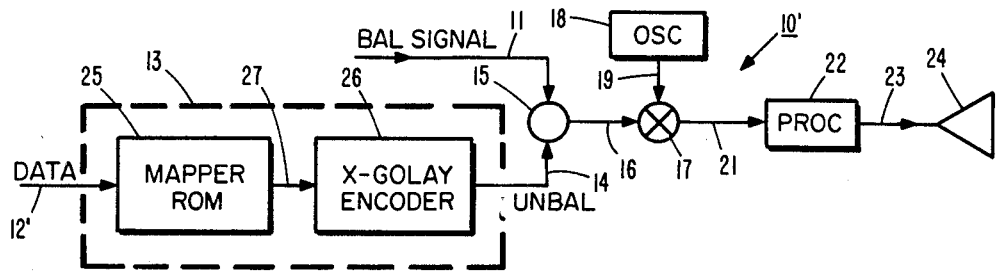
FIG. 2 is a modified logic block diagram of the transmitter shown in FIG. 1 further showing an alternative purged code encoder for preparing coded data signals for transmission.

FIG. 2 is a modified logic block diagram of the structure shown in FIG. 1. The purged code encoder 13 shown in phantom lines is replaced with a mapper ROM 25 and an extended Golay purged code encoder 26. The balance signal on line 11 and the unbalanced signal on line 14 are combined in combining means 15 to provide the balanced code set signal on line 16 as was explained hereinbefore.

As an example of a preferred use of the structure shown in FIG. 2, assume that eight data bits are being presented in blocks on line 12 and applied to mapper ROM 25. The mapper ROM 25 is in the preferred embodiment a 256×12 ROM which provides twelve bits of information on output line 27. The twelve information bits may be applied to an extended Golay encoder 26 to produce a codeword twenty-four bits long on line 14. The codeword only contains the equivalent of eight bits of original data information but now also contains the desired unbalance as well as error correction bits to be employed for error correction at the receiver.

The transmitters 10 and 10' shown in FIGS. 1 and 2 may be operated in a non-spread spectrum mode of operation as well as in a spread spectrum mode of operation. In the non-spread spectrum mode of operation, the balance code signals on lines 11 are turned off. In this mode of operation, the combiner means 15 is preferably a modulo-2 adder which produces an unbalance code signal on line 16 which is identical to the unbalanced code signal on line 14.

Figure 3:
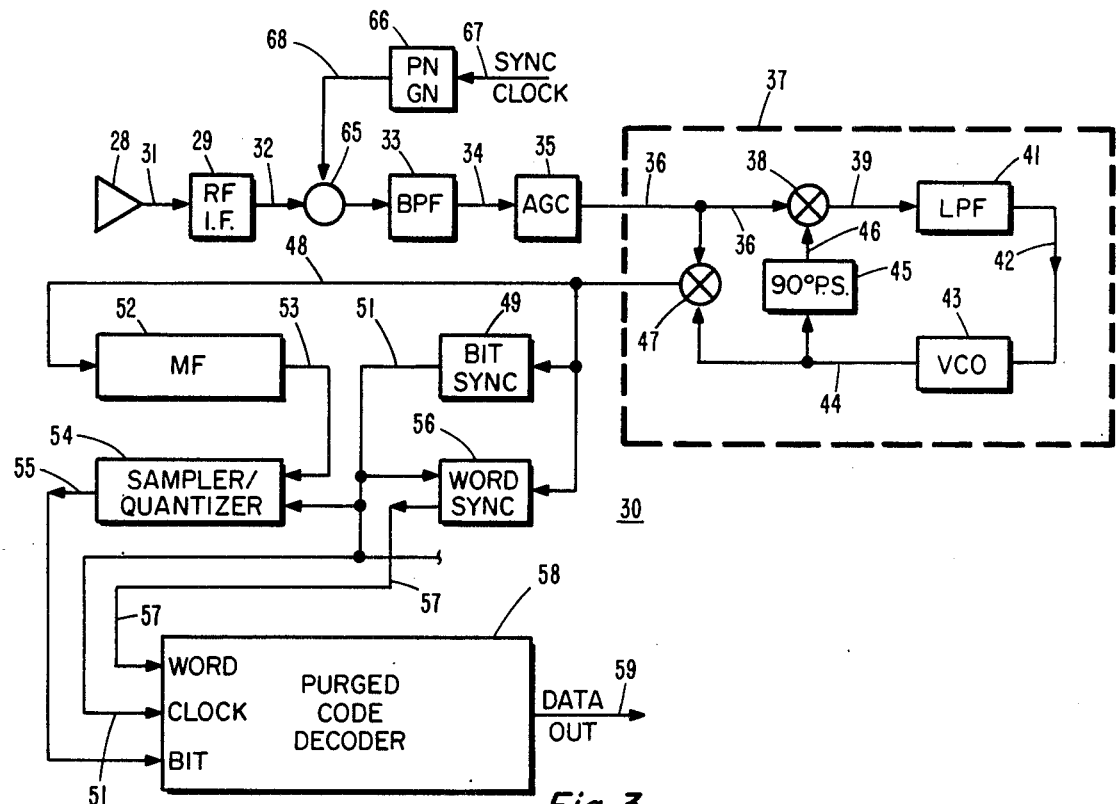
FIG. 3 is a simplified logic block diagram of a receiver for receiving spread spectrum coded signals and for detecting data bits transmitted from the transmitting apparatus.

Refer now to FIG. 3 showing a simplified logic block diagram of a receiver for receiving the aforementioned non-spread spectrum coded signal. In a non-jamming environment, the non-spread spectrum receiver 30 receives the unbalanced code signal transmitted from antenna 24. The aforemention unbalanced code signal is received at antenna 28 and applied to the radio frequency to intermediate frequency down converter 29 via line 31. The intermediate frequency signal on line 32 is applied to bandpass filter 33 to provide a noise limited intermediate frequncy signal on line 34. The variable amplitude signal on line 34 is controlled to a fixed amplitude in automatic gain controller 35. The fixed amplitude signal on line 36 is applied to the carrier tracking loop 37 which comprises a mixer 38. The output from mixer 38 on line 39 is applied to the lowpass filter 41 to produce an output on line 42 which is applied to the voltage controlled oscillator 43. The output from voltage controlled oscillator 43 on line 44 is first applied to the ninety degree phase shifter 45 to provide an output on line 46 which is applied to the mixer 38. The application of the phase shifted signal on line 46 to mixer 38 provides quadrature tracking of the signal on line 36. When the carrier tracking loop 37 is properly tracking, the signal on line 44 is in absolute phase with the signal on line 36. Accordingly, when the signals on line 36 and 44 are applied to the coherent detector 47, there is provided an output signal on line 48 which is coherently reduced to a bandpass signal. The coherent detector 47 effectively removes the intermediate frequency carrier from the unbalanced code signal on line 36 leaving an unbalanced signal at bandpass frequency. An analog output signal is produced on line 48 which is applied to a bit synchronizer 49 to provide a data clock signal as an output on line 51.

When the transmitter 10 or 10' shown in FIGS. 1 and 2 employ a pseudonoise generated balanced signal on line 11 which is mixed with the unbalanced signal on line 14, a balanced signal is produced on line 16 and transmitted from the antenna 24. When this signal is received at antenna 26, the signal on line 32 from converter 29 is stepped down and demodulated by mixer 65 before being applied to band pass filter 33. Pseudonoise generator 66 is synchronized with the incoming pseudonoise (P.N.) generated balanced signal from the transmitter by a sync clock signal on line 67 which is capable of tracking the incoming signal and applying the P.N. signal on line 68 to mixer 65 which removes the P.N. component of the signal leaving an unbalanced signal applied to filter 33. It will be understood that mixer 65 and P.N. generator 66 are not employed when the received signal is unbalanced and has no P.N. component. A P.N. signal is equivalent to high frequency random noise and when mixed with a much lower frequency unbalanced data signal produces a modulated signal which appears to be balanced. The present transmitting and receiving system is capable of improved operation whether or not balanced signals are being transmitted by transmitter 10.

The analog output signal on line 48 is an unbalanced analog signal. For purposes of this invention, the unbalanced transmitted signal from transmitter 10 was produced by selecting sets of binary symbols to represent sets of data bits, unbalance bits and error correction bits. The unbalanced data symbols contain a plurality of predetermined bits where there is an imbalance of ones and zeros in the sequence of the bits being transmitted. The received unbalanced code signal provided on line 31 of the receiver may be coherently recovered to provide an unbalanced output signal on line 48. Since the signal on line 48 is unbalanced, it may be coherently detected without the requirement of special tracking circuitry.

The analog output signal on line 48 may be detected by matched filter 52. The detected signal on line 53 is still an analog signal which is applied to sampler-quantizer 54 along with the clock signal on line 51. The signal on line 51 is marking clock time and the output from sampler-quantizer 54 is producing digital representation of an individual bit on line 55 during clock time. The clock signal on line 51 is also applied to a word synchronizer 56 which produces an output signal on line 57 indicative of the start and finish of the aforementioned twenty-four bit codeword. The three input lines 51, 55 and 57 are applied to a purged code decoder 58. It will be understood that the information from sampler-quantizer 54 on line 55 is in the form of a one or zero when there is a hard decision being provided to decoder 58. When a soft decision is being provided to the decoder 58, a plurality of lines 55 are employed to supply the soft decision information. For purposes of simplicity in explaining the present invention, a hard decision on line 55 will be employed hereinafter.

The purged code decoder 58 may be constructed of a matched filter for each codeword in the code. As explained hereinbefore as an example starting with an eight bit information word on line 12 and converting this into a codeword twenty-four bits long for transmission at antenna 24, there will be required two hundred fifty-six matched filters twenty-four bits long. The output from the purged code decoder 58 is provided on line 59. The data output on line 59 may be described as the best estimate of the data word on line 12.

If the analog signal on line 48 is applied directly to a purged code decoder 58 comprising two hundred fifty-six matched filters that are twenty-four bits long, the result on data output line 59 will be a maximum likelyhood estimate of the data which was originally transmitted.

The purged code decoder 58 may be simplified with only a small degradation in the performance of the output. For example, the analog signal on line 48 may be digitized as has been shown in FIG. 3 before being applied to the purged code decoder 58. The larger the number of levels which are employed in the sampler-quantizer 54, the smaller will be the amount of degradation in the output performance.

Figure 4:
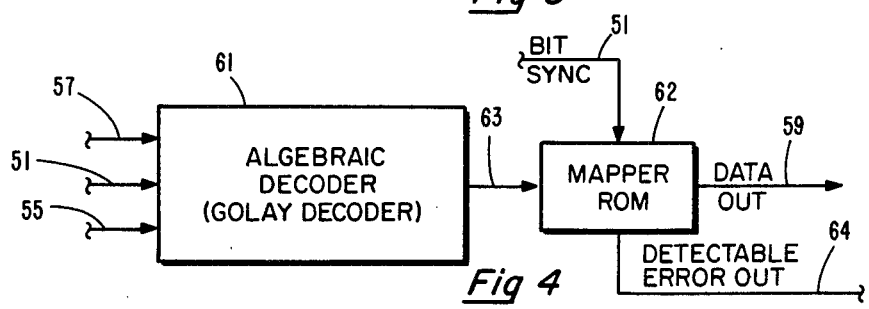
FIG. 4 is a modified logic block diagram circuit of a modified form of the purged code decoder shown in FIG. 3 for detecting data bits transmitted from said transmitted apparatus and for generating detectable error signal outputs.

Refer now to FIG. 4 showing a modified form of the purged code decoder 58 comprising an algebraic decoder 61 and a mapper ROM 62. The word, clock and bit information lines 57, 51 and 55 are applied to the algebraic decoder 61 to produce one of the codewords of the full code on line 63. The codeword on line 63 is applied to mapper ROM 62 which functions as a look-up table to produce one of the words of the purged code on data output line 59 or alternatively a detectable error output on line 64. There are two possible modes of operation for mapper ROM 62. In a first mode of operation, the proper data is presented on data output line 59 or a detectable error output is presented on output line 64. As an alternative method of operation, the mapper ROM may map the detectable errors onto their best estimate of the data words and present them on data output line 59. In this latter mode of operation, there is no requirement for the error output signal on line 64.

In the preferred embodiment shown in FIG. 1, a simplified purged code encoder 13 was employed. The purged code encoder may be made from a ROM used as a look-up table. Assume that the eight bits of binary data on line 12 are mapped into twenty-four bit codewords on line 14 as follows:

| NO | 8 BINARY BITS DATA | 24 BIT CODE WORDS | |
|----|--------------------|--------------------|--|
| 0  | 00000000 | 100000000000 | 101011100011 |
| 1  | 00000001 | 000000000010 | 101110001101 |
| 2  | 00000010 | 000000000101 | 011100011001 |
| 3  | 00000011 | 000000001010 | 111000110001 |
| —  | etc.     | etc.         | etc.         |
| 23 | 00010111 | 010000000000 | 111110010010 |
| —  | etc.     | etc.         | etc.         |
| 47 | 00101111 | 001000000000 | 110100101011 |

The above bits and codewords are a small portion of an extended Golay code. The codewords have a constant-weight of two zeroes for each one in the codeword and maintains the error correction capability of a full Golay code. Any code twenty-three bits in length, having twelve information bits and a minimum distance of seven bits is considered to be a Golay code. Block codes, such as Golay codes, are defined by length (n), information (k) and minimum distance (d). Thus, all Golay codes meet the criteria of (23, 12, 7) (n, k, d) and inversely all codes which meet this cirteria are Golay codes. The minimum distance (d) describes that all words in the code differ in at least seven of the twenty-three bit positions from each other. As a result of a distance of seven, the code can correct three errors in the twenty-three bit positions. The Golay codeword of twenty-three bits may be extended to twenty-four bits by adding one overall parity check bit. The even parity check bit is preferably provided at the right end or lowest order of the codeword as shown above for mathematical convenience.

The above-illustrated codewords are shown to be twenty-four bits in length. If a full code of $2^{12}$ codewords (ie., 4096 codewords) are employed in the encoders and the decoders, the left-most twelve bits would be represented by the data bits. The right-most or lowest order bit would represent the parity bit and the eleven next lowest order bits would represent the check bits (sometimes called parity check bits).

In the preferred embodiment encoders and decoders employed in the present invention, only two hundred fifty-six codewords of the full 4096 codewords are chosen for use, thus, the Golay code is contracted or purged. It will be understood that those skilled in the art of selecting purged Golay codes or extended Golay codes may select sets of codewords designed to improve different performance characteristics which may be inconsistent with each other.

One desirable characteristic to be achieved in purged codes is to improve the distance structure which in turn results in optimum error correction performance.

Another desirable characteristic, achieved by selecting proper purged, codes is to optimize the imbalance which will result in improved tracking.

Yet another desirable characteristic in selecting purged codes is to optimize the selection of codewords so that the circuit hardware is simplified and/or may be made cheaply.

Having explained that a set of Golay codewords may be selected to enhance a desirable characteristic, it will now be understood that twenty-four bit extended Golay codewords may be written into the memory look-up table 13 as shown in FIG. 1. The eight bit data words on line 12 are thus capable of producing the extended twenty-four bit Golay codewords on line 14.

Purging is accomplished by selecting a sub-set of the full code. An example of selecting a purged code is to first select the unbalance of zeros to one such as two to one, then select the number of codewords required in the sub-set and the weight distribution. As explained above, eight bits of data are capable of defining 256 codewords and a weight of eight is also desirable (i.e., 8 ones and 16 zeros for a 2 to 1 unbalance). An extended Golay (24, 12) code meets this requirement and has 759 codewords, twenty-four bits long of weight 8. Out of the 759 codewords, 256 may be selected for the sub-set based on the desired distance structure, the spectrum and the techniques used for decoding. The eight data bits of the purged code are mapped into twelve data bits, then the 12 data bits are encoded into the full twenty-four bit codeword.

Another example of a desirable sub-set selected from an extended Golay (24, 12) code is a purged code having only 128 unbalanced codewords of twenty-four bits each. The codewords have a weight of eight and an average distance structure of: one word at a distance of zero, forty-four codewords at a distance of eight, eighty-one codewords at a distance of twelve and three codewords at a distance of sixteen.

In the embodiment shown in FIG. 2, the eight bit data words applied to a look-up table 13 produce twelve information bits on line 27 which in turn are capable of producing twenty-four bit codewords from the output of the extended Golay encoder 26. Such encoders and decoders described hereinbefore are commercially available to user specification from Cyclotomics, Inc. of Berkely, Calif.

The twenty-four bit codewords which are being applied to the purged code decoders shown in FIGS. 3 and 4 will recover the original eight data bits as an output on line 59. When prior art matched filters are employed in decoder 58, the structure becomes expensive and rather complex. However, when an algebraic decoder (X-Golay) 61 is employed, the output on line 63 is a twelve-bit word containing the information bits described hereinbefore. The twelve information bits on line 63 may be applied to the look-up table 62 to provide the original eight data bits entered on line 12. It will be appreciated that the circuitry shown and described in FIGS. 3 and 4 is cheaper and simpler than employing a large array of matched filters. Algebraic decoders, and more specifically extended Golay decoders, are commercially available which will accept either hard or soft decision representations of the twenty-four bits on line 55. It has been found that the simplified circuitry shown in FIG. 4 will require approximately one quarter of one decibel additional signal power to achieve the same results as would be achieved employing the more complex and more expensive structures of the prior art.

We claim:

1. Transmitting and receiving apparatus, comprising:
means for generating balanced code set signals,
means for generating digital data signals,
a purged code encoder coupled to said digital data signals for generating constant-weight unbalanced codewords defining said data signals and containing error correction bits,
means for combining said balanced code set signals and said unbalanced codewords to provide balanced digital signals defining said data signals and containing error correction bits for transmission,
transmitting means,
means for receiving said balanced digital signals containing error correction bits,
detector means comprising carrier tracking loop means connected to said receiving means for tracking said received signals,
said detector means adapted to remove said balanced code set signals and for recovering said unbalanced codewords and having bit synchronization signal means, word synchronization signal means and means for producing quantized data bit signals, and
purged code decoder means coupled to said bit synchronization signal means, said word synchronization signal means and said quantized data bit signals for producing a best estimate of said data signals as an output.

2. Transmitting and receiving apparatus as set forth in claim 1 wherein said purged code encoder comprises input memory means having said unbalanced codewords stored therein.

3. Transmitting and receiving apparatus as set forth in claim 1 wherein said purged code encoder comprises:
input memory means coupled to an encoder for generating said constant-weight unbalanced codewords.

4. Transmitting and receiving apparatus as set forth in claim 1 wherein said purged code encoder comprises:
input memory means coupled to an extended Golay encoder for generating said constant-weight unbalanced codeword.

5. Transmitting and receiving apparatus as set forth in claim 4 wherein said purged code decoder comprises an extended Golay decoder, and
output memory means coupled to said extended Golay decoder for producing said data output signals.

6. Transmitting and receiving apparatus as set forth in claim 1 wherein said purged code decoder comprises a matched filter decoder.

7. Transmitting and receiving apparatus as set forth in claim 1 wherein said purged code decoder comprises:
a hard decision algebraic decoder, and
output memory means coupled to said algebraic decoder for producing said data output signals.

8. Transmitting and receiving apparatus as set forth in claim 1 wherein said purged code decoder comprises:
a soft decision algebraic decoder, and
output memory means coupled to said algebraic decoder for producing said data output signals.

9. Transmitting and receiving apparatus as set forth in claim 7 wherein said data output signals from said output memory means include correct data signals and detectable erroneous data signals.

10. Transmitting and receiving apparatus as set forth in claim 9 wherein said data output signals from said output memory means further include a very small percentage of undetectable erroneous data signals.

11. Transmitting and receiving apparatus as set forth in claim 1 wherein said purged code encoder comprises a set of 128 unbalanced codewords having twenty-four bits each, a weight of eight and an average distance structure of: one word at a distance of zero, 44 words at a distance of eight, 80 words at a distance of twelve and three words at a distance of sixteen.

* * * * *